(12) United States Patent
Kakoschke et al.

(10) Patent No.: US 6,429,520 B1
(45) Date of Patent: Aug. 6, 2002

(54) SEMICONDUCTOR COMPONENT WITH SILICON WIRING AND METHOD OF FABRICATING THE COMPONENT

(75) Inventors: Ronald Kakoschke; Regina Stokan, both of München (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/391,039

(22) Filed: Sep. 7, 1999

(51) Int. Cl.$^7$ ................................................ H01L 23/48
(52) U.S. Cl. ...................................................... 257/758
(58) Field of Search ................................ 257/758, 751, 257/761, 763, 765, 759, 760, 774; 438/624, 638

(56) References Cited

U.S. PATENT DOCUMENTS

| | | | |
|---|---|---|---|
| 4,888,306 A | * 12/1989 | Komatsu et al. | ............ 438/624 |
| 4,890,141 A | 12/1989 | Tang et al. | |
| 5,654,589 A | 8/1997 | Huang et al. | |
| 5,940,151 A | * 8/1999 | Ha | ................ 349/43 |
| 6,138,686 A | * 10/2000 | Gambino et al. | ............ 438/624 |
| 6,157,082 A | * 12/2000 | Merchant et al. | ............ 257/758 |

FOREIGN PATENT DOCUMENTS

| | | | | |
|---|---|---|---|---|
| EP | 0 021 400 A1 | | 1/1981 | |
| EP | 0 078 220 A2 | | 5/1983 | |
| JP | 350963 | * | 4/1992 | ............ H01L/27/08 |

* cited by examiner

*Primary Examiner*—Howard Weiss
*Assistant Examiner*—(Vikki) Hoa B. Trinh
(74) *Attorney, Agent, or Firm*—Laurence A. Greenberg; Werner H. Stemer; Gregory L. Mayback

(57) ABSTRACT

A semiconductor component has local silicon wiring. A first silicon region and a second silicon region are doped with dopants of opposite conductivity. The second silicon region is arranged at least partially over the first silicon region and is separated from it by an insulation layer. The insulation layer is formed with an opening. A conductive layer is disposed at the opening. The conductive layer is composed of a metal, a metal nitride or a combination thereof and connects the first and the second silicon regions electrically to one another.

10 Claims, 1 Drawing Sheet

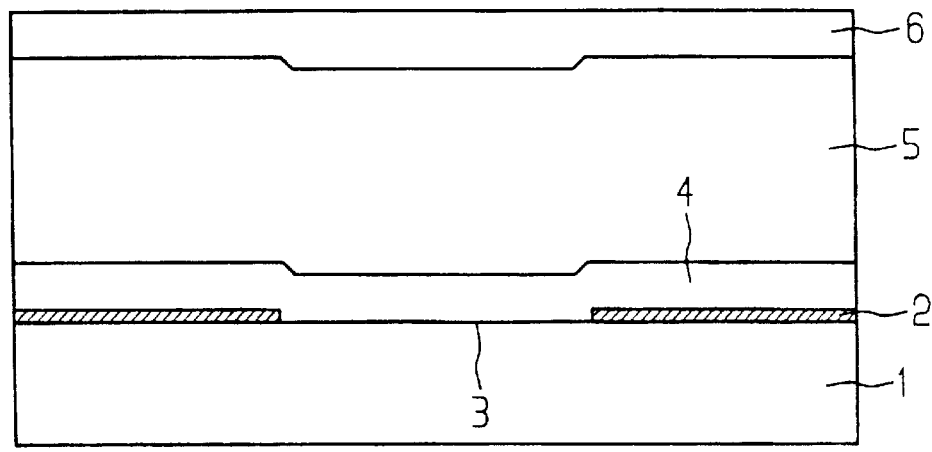
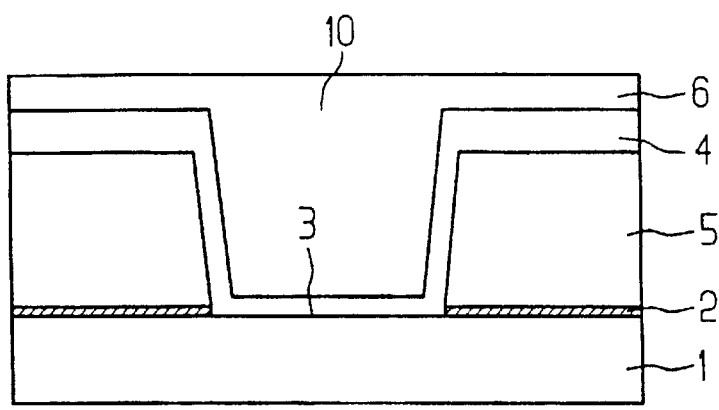
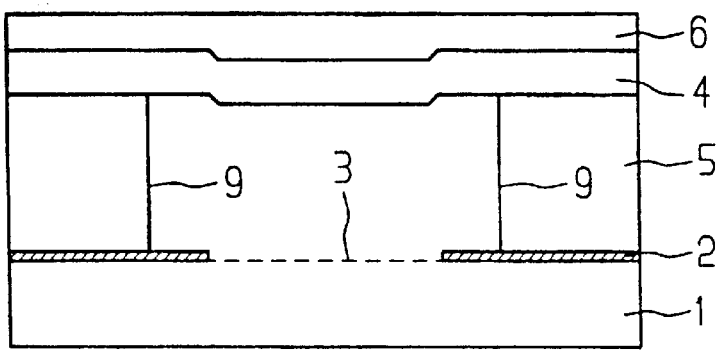

SEMICONDUCTOR COMPONENT WITH SILICON WIRING AND METHOD OF FABRICATING THE COMPONENT

BACKGROUND OF THE INVENTION

1. Field of the Invention

The invention lies in the semiconductor technology field. More specifically, the invention relates to a semiconductor component having at least local silicon wiring and to a method of fabricating the semiconductor component.

Integrated circuits, in particular CMOS circuits, are fabricated with a plurality of process steps. The fabrication costs of the circuits are thereby determined by the processing complexity and the physical processing time. Highly complex modules frequently require several hundred individual process steps and a number of days for the processing run of the product.

Some of the process steps must be provided for the purpose of producing the wiring which connects the individual active components to one another and ensures the connection of the integrated circuit to the "exterior." The wiring is usually realized by means of one or more conductor levels made of aluminum.

However, there are applications in which a conductor level made of aluminum is, in the first instance, too expensive and, in the second instance, requires too much space. In order to overcome this problem, local connections made of polysilicon, silicide or polycide are usually used. In that context, European published patent application EP 0 208 267 describes a static read-write memory (SRAM) in which the "gate level," comprising doped polysilicon and metal silicide, is used as an additional local wiring level for the cross coupling between n-type and p-type channel transistors. In rare cases, polysilicon is also used as a complete, global wiring level in pure NMOS technologies.

However, when CMOS circuits are realized with polysilicon wiring a series of difficulties occur. For instance, the n+ source/drain zones of n-channel transistors are connected to the p+ source/drain zones of p-type channel transistors with polysilicon tracks. In order to permit good contact to be brought about between an n+ diffusion zone and a polysilicon track, the polysilicon track must also have n-type doping at the contact point. On the other hand, in order to permit good contact to be brought about between a p+ diffusion zone and a polysilicon track the polysilicon track must have p-type doping at the contact point. As a result of this it is necessary to connect an n-type conductive polysilicon region to a p-type conductive polysilicon region somewhere on the path from the n+ diffusion zone to the p+ diffusion zone. The pn-junction which occurs here leads to high contact resistances which severely restricts the use of polysilicon wiring. Moreover, in the so-called "dual gate technique" of modern CMOS technology both p+ and n+ doped gates made of polysilicon, which are structured on one level, are used. If different gates are then connected by a polysilicon track, pn-junctions occur once more and have to be bridged.

SUMMARY OF THE INVENTION

It is accordingly an object of the invention to provide a semiconductor component having at least local polysilicon wiring and a method of producing the component, which overcomes the above-mentioned disadvantages of the heretofore-known devices and methods of this general type and which significantly reduces the above-noted problems.

With the foregoing and other objects in view there is provided, in accordance with the invention, a semiconductor component with local silicon wiring, comprising:

a first silicon region doped with a dopant of a first conductivity type;

a second silicon region doped with a dopant of a second conductivity type and disposed at least partially above the first silicon region;

an insulation layer between the first silicon region and the second silicon region, the insulation layer having an opening formed therein; and a conductive layer made of a material selected from the group consisting of metal, metal nitride, and a combination thereof and disposed in vicinity of the opening formed in the insulation layer, the conductive layer electrically connecting the first silicon region with the second silicon region via the opening.

By using a metal and/or metal nitride layer it is possible for pn-type junctions which occur between differently doped silicon regions to be bridged, or for the metal layers and/or metal nitride layers to be arranged between the silicon regions, in such a way that a pn-type junction is not even formed. This also makes it possible to realize a complete global wiring level made of silicon in a CMOS circuit without the function of this wiring level being disrupted by the increased contact resistances which would occur otherwise and which are caused by the pn-type junctions. In this way, it is possible to dispense with one metallization level, which has a positive effect both on the process complexity and on the area which the CMOS circuit requires.

Furthermore, wiring made of silicon, which is preferably composed of polysilicon, makes external manipulation or subsequent analysis of a circuit considerably more difficult. In order to be able to carry out manipulations to an integrated circuit, it is usually necessary firstly to analyze the integrated circuit. To do this, the passivation layer or the insulation layers between the wiring levels must firstly be removed layer by layer so that the wiring levels which are exposed in this way can be examined. However, the chemical processes which have to be used to remove the insulation layers, in particular PSG and BPSG, also attack the metal layer and/or metal nitride layer and remove this as well. As a result, it is no longer possible to tap an electrical signal on an exposed wiring level, which makes it virtually impossible to analyze the integrated circuit.

Titanium, tantalum or tungsten are preferably used as the metal and their nitrides as the metal nitrides. In particular, these materials exhibit good electrical conductivity, have excellent adhesion to silicon and act as a diffusion barrier for the dopants which are located in the adjoining silicon regions. The conductive layer can be formed here as a pure metal layer, pure metal nitride layer or as a combination of metal layer and metal nitride layer. Pure metal nitride layers and a combination of metal layer and metal nitride layer are particularly preferred. It is favorable to select the combination of metal and associated metal nitride.

The semiconductor component according to the invention thus makes possible applications in which the important factors are cost-effective production and a high degree of protection against external manipulation. Processors for chip cards and smart cards are an example of such an application. The processors for chip cards must, in the first instance, be cheap so that as many fields of application for a chip card can be exploited economically. On the other hand, chip cards are frequently used in access supervision systems or in electronic payment transactions so that they have to be as resistant as possible to unauthorized manipulation. The silicon wiring is implemented here as polysilicon wiring for reasons of cost and to simplify fabrication.

Other features which are considered as characteristic for the invention are set forth in the appended claims.

Although the invention is illustrated and described herein as embodied in a semiconductor component having silicon wiring and a method for fabricating said component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic side view of a first embodiment of the semiconductor component according to the invention;

FIG. 2 is a diagrammatic view of a second embodiment of the semiconductor component according to the invention; and FIG. 3 is a diagrammatic view of a third embodiment of the semiconductor component according to the invention.

DESCRIPTION OF THE PREFERRED EMBODIMENTS

Referring now to the figures of the drawing in detail and first, particularly, to FIG. 1 thereof, a first embodiment of the semiconductor component is fabricated by first applying a polysilicon layer 1, as a first silicon region, to a non-illustrated semiconductor substrate which has already been prestructured. The thickness of the polysilicon layer 1 is approximately 250 nm here. An n+ doping ($2.0 \cdot 10^{20}$ cm$^{-3}$) of the layer 1 then follows, for example by means of arsenic or phosphorus implantation.

A so-called ONO layer 2 (silicon oxide, silicon nitride, silicon oxide) is then applied, as insulation layer 2, to the n+ doped polysilicon layer. An opening 3 is produced in the insulation layer 2 by means of a phototechnique. A TiN layer 4 (or Ti/TiN layer) is then deposited, the layer being applied directly to the polysilicon layer 1 in the vicinity of the contact hole 3. The TiN layer 4 here has, for example, a thickness of approximately 100 nm. Other suitable materials are WN, W/WN, TaN and Ta/TaN.

A second polysilicon layer 5 is then deposited, as a second silicon region, on the TiN layer 4. The polysilicon layer 5 can also be doped during the deposition process (in situ) or by means of a subsequent boron implantation. The implantation energy is, for example, 20 keV and the implantation dose is approximately $5.0 \cdot 10^{15}$ cm$^{-2}$, so that a doping of approximately $5.0 \cdot 10^{19}$ cm$^{-3}$ is produced. The polysilicon layer 5 and the TiN layer 4 are then structured, so that the structure shown in FIG. 1 is produced. Here, silicon regions 1 and 5, which have different doping (the n-type doped polysilicon layer 1 and the p-type doped polysilicon layer 5) are then connected to one another by means of a TiN layer 4.

Further wiring levels can then be produced on the semiconductor component according to the invention. For example, a BPSG layer 6 (boron phosphorous silicate glass) can be deposited as a further insulation layer, which is then subjected to a temperature treatment (fluidizing). A first aluminum layer can then be applied to the BPSG layer 6. However, before the BPSG layer is applied, silicon oxide can also be produced by means of a so-called TEOS method. This is followed by so-called "post oxide" (approximately 20 nm) and a thermal treatment at approximately 950° C. for approximately 20 min before the BPSG is applied.

FIG. 2 shows a schematic view of a second embodiment of the semiconductor component according to the invention.

In order to fabricate the second embodiment, a polysilicon layer 1 is applied to a non-illustrated, already prestructured semiconductor substrate. The thickness of the polysilicon layer 1 is approximately 250 nm here. n+ doping ($2.0 \cdot 10^{20}$ cm$^{-3}$) of this layer then follows, for example by means of arsenic or phosphorus implantation.

An ONO layer 2 (silicon oxide, silicon nitride, silicon oxide) is then applied, as insulation layer 2, to the n+ doped polysilicon layer 1. It is also possible for the insulation layer 2 to be composed of just silicon nitride or silicon oxide. This is then followed by the deposition of a second polysilicon layer 5 onto the ONO layer 2. The doping of the polysilicon layers can also be carried out during the deposition process (in situ) or can be effected by means of a subsequent boron implantation. The implantation energy is, for example, 20 keV and the implantation dose is approximately $5.0 \cdot 10^{15} \cdot$ cm$^{-2}$ so that doping of approximately $5.0 \cdot 10^{19}$ cm$^{-3}$ is produced.

By means of a phototechnique, a contact hole 10 is then produced in the polysilicon layer 5 and in the insulation layer 2. This is then followed by the deposition of a Ti/TiN layer 4 or of another metal layer/metal nitride layer, which is applied directly to the polysilicon layer 1 in the vicinity of the contact hole 10. The Ti/TiN layer here has a thickness of, for example, approximately 100 nm, a thin Ti layer and subsequently a TiN layer being applied. The metal layer/metal nitride layer 4 is preferably applied by means of highly conformal CVD deposition processes.

The polysilicon layer 5 and the Ti/TiN layer 4 are then structured so that the structure shown in FIG. 2 is produced. Here, the silicon regions 1 and 5 which have different doping (the n-type doped polysilicon layer 1 and the p-type doped polysilicon layer 5) are conductively connected to one another by means of the Ti/TiN layer 4.

Here, the second embodiment has, in comparison with the first embodiment of the present invention, the advantage that in the second embodiment the Ti/TiN does not essentially come into direct contact with the ONO layer 2. In this way, damage to the ONO layer 2, which could result from reaction of the titanium with the oxide, can be reliably avoided.

Further wiring levels can subsequently be produced on the semiconductor component according to the invention. For example, a PSG or BPSG layer 6 can be deposited, which layer is then subject to a temperature treatment (fluidizing). A first aluminum layer can then be applied to the PSG or BPSG layer. However, before the PSG or BPSG layer is applied, silicon oxide can also be produced by means of a so-called TEOS method. This is followed by a so-called "post oxide" (approximately 20 nm) and thermal treatment at approximately 950° C. for approximately 20 min before the BPSG layer is applied.

The n+ doped polysilicon layer 1 of this embodiment can also be replaced by a crystalline silicon region so that contact with the diffusion zone in the silicon substrate is made by means of a polylevel. This contact with the diffusion zone has the advantage that the polytrack and the diffusion zone do not need to be of the same conductivity type. The ONO layer 2 (silicon oxide, silicon nitride, silicon oxide) can also be replaced by another insulation layer.

FIG. 3 shows a schematic view of a third embodiment of the semiconductor component according to the invention.

In order to fabricate a semiconductor component according to the invention according to a third embodiment, a polysilicon layer 1 is applied to an already prestructured semiconductor substrate (not shown). The thickness of the polysilicon layer is is approximately 250 nm here. The doping of the polysilicon layer 1 can also be carried out during the deposition process (in situ) or can be effected by means of a subsequent phosphorus implantation. The implantation energy is, for example, 20 keV and the doping is set to approximately $2.0 \cdot 10^{20}$ cm$^{-3}$.

An ONO layer 2 (silicon oxide, silicon nitride, silicon oxide) is then applied, as insulation layer 2, to the n+ doped polysilicon layer 1, and an opening 3 is produced in the insulation layer 3 by means of a phototechnique.

This is followed by the deposition of a second polysilicon layer 5 onto the insulation layer 2 or in the vicinity of the opening 3 on the polysilicon layer 1. This is then followed by p-type doping (for example $5.0 \cdot 10^{19}$ cm$^{-3}$) of the layer 5 by a boron implantation (implantation dose: approximately $5.0 \cdot 10^{15}$ cm$^{-2}$).

By means of a thermal treatment, for example at a temperature of approximately 950° C. for approximately 20 min, which is carried out now or later, the dopant diffuses phosphorous out of the polysilicon layer 1 into part of the second polysilicon layer 5, which leads to redoping of the polysilicon layer 5 via the opening 3. This redoping extends as far as the surface of the second polysilicon layer 5 and accordingly two essentially vertical pn-type junctions 9 are formed in the second polysilicon layer 5.

This is then followed by the deposition of a TiN layer 4 (or Ti/TiN layer) which is applied directly to the polysilicon layer 5. The TiN layer has here, for example, a thickness of approximately 100 nm. This is then followed by structuring of the polysilicon layer 5 and of the TiN layer 4, so that the structure shown in FIG. 3 is produced. Here, silicon regions which have different doping (the p-type doped polysilicon layer 5 and the n-type doped polysilicon layer 1 and n-type doped regions in the polysilicon layer 5) are conductively connected to one another via a TiN layer 4.

Further wiring levels can subsequently be produced on the semiconductor component according to the invention. For example, it is possible to deposit a BPSG layer 6, which is then subjected to a temperature treatment (reflow fluidizing). A first aluminum layer can then be applied to the BPSG layer. However, before the BPSG layer is applied, silicon oxide can also be produced by means of a so-called TEOS method. This is followed by a so-called "post oxide" (approximately 20 nm) and thermal treatment at approximately 950° C. for approximately 20 min before the BPSG layer is applied.

We claim:

1. A semiconductor component with local silicon wiring, comprising:
    a first silicon region doped with a dopant of a first conductivity type;
    a second silicon region doped with a dopant of a second conductivity type and disposed at least partially above said first silicon region;
    an insulation layer between said first silicon region and said second silicon region, said insulation layer having an opening formed therein; and
    a conductive layer made of a material selected from the group consisting of metal, metal nitride, and a combination thereof and disposed in vicinity of said opening formed in said insulation layer, said conductive layer electrically connecting said first silicon region with said second silicon region via said opening.

2. The semiconductor component according to claim 1, wherein said conductive layer is disposed on said insulation layer and directly on said first silicon region within said opening, and said second silicon region is disposed on said conductive layer.

3. The semiconductor component according to claim 2, wherein at least one of said first and second silicon regions is composed of polysilicon, and said polysilicon region forms part of a complete wiring level made of polysilicon.

4. The semiconductor component according to claim 1, wherein said insulation layer is composed of a material selected from the group consisting of silicon oxide, silicon nitride, and a combination thereof.

5. The semiconductor component according to claim 1, wherein said second silicon region is formed with a contact hole in vicinity of said opening formed in said insulation layer, said contact hole extending to said first silicon region, and said conductive layer lining said contact hole.

6. The semiconductor component according to claim 5, wherein said conductive layer covers said second silicon region and said contact hole in conformal fashion.

7. The semiconductor component according to claim 5, which comprises a further insulation layer selected from the group consisting of a PSG layer and a BPSG layer formed on said conductive layer.

8. The semiconductor component according to claim 5, wherein at least one of said first and second silicon regions is composed of polysilicon, and said polysilicon region forms part of a complete wiring level made of polysilicon.

9. The semiconductor component according to claim 5, wherein said insulation layer is composed of a material selected from the group consisting of silicon oxide, silicon nitride, and a combination thereof.

10. The semiconductor component according to claim 1, wherein said conductive layer is composed of a material selected from the group consisting of titanium, titanium nitride, tungsten, tungsten nitride, tantalum, tantalum nitride, and a combination thereof.

* * * * *